United States Patent
Li et al.

(10) Patent No.: US 12,107,155 B2
(45) Date of Patent: *Oct. 1, 2024

(54) SELF-ORGANIZED QUANTUM DOT SEMICONDUCTOR STRUCTURE

(71) Applicant: National Yang Ming Chiao Tung University, Hsinchu (TW)

(72) Inventors: Pei-Wen Li, Hsinchu (TW); Kang-Ping Peng, Yuli Township (TW); Ching-Lun Chen, Baoshan Township, Hsinchu County (TW); Tsung-Lin Huang, Kaohsiung (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 420 days.

This patent is subject to a terminal disclaimer.

(21) Appl. No.: 17/531,688

(22) Filed: Nov. 19, 2021

(65) Prior Publication Data

US 2022/0085194 A1 Mar. 17, 2022

Related U.S. Application Data

(63) Continuation-in-part of application No. 16/932,691, filed on Jul. 17, 2020, now Pat. No. 11,227,765.

(51) Int. Cl.
*H01L 29/775* (2006.01)
*G06N 10/00* (2022.01)
*H01L 29/12* (2006.01)
*H01L 29/16* (2006.01)

(52) U.S. Cl.
CPC .......... *H01L 29/775* (2013.01); *G06N 10/00* (2019.01); *H01L 29/122* (2013.01); *H01L 29/16* (2013.01)

(58) Field of Classification Search
None
See application file for complete search history.

(56) References Cited

U.S. PATENT DOCUMENTS 11,227,765 B1 * 1/2022 Li .......................... H01L 29/16
2010/0308328 A1 * 12/2010 Makihara ........... G11C 16/0441
257/E29.002

* cited by examiner

*Primary Examiner* — Alexander G Ghyka
(74) *Attorney, Agent, or Firm* — TOMANAGEIP

(57) ABSTRACT

The invention provides a self-organized quantum dot semiconductor structure. The quantum dot semiconductor structure includes: a conductive ridge on a substrate; an insulative layer covering the substrate and the conductive ridge, wherein the insulative layer includes a top portion and two sidewalls over the conductive ridge; a semiconductor mechanism of etching back and thermal oxidation, implemented on a semiconductor-alloyed layer set on the insulative layer; a plurality of quantum dots respectively embedded within a plurality of silicon dioxide spacer islands based on the semiconductor mechanism, the quantum dots and the silicon dioxide spacer islands adhered to the sidewalls of the insulative layer; and a plurality of conductive ledges adhered to the silicon dioxide spacer islands, wherein each of the conductive ledges is a portion of an electrode self-alignment to the quantum dot.

17 Claims, 8 Drawing Sheets

Quantum dot (Spherical)

Quantum dot (Spherical)

Quantum dot (Spherical)

SELF-ORGANIZED QUANTUM DOT SEMICONDUCTOR STRUCTURE

BACKGROUND OF THE INVENTION

Field of Invention

The present invention relates to a quantum dot semiconductor structure, especially a quantum dot semiconductor structure formed with tunable size and self-aligned electrode capability, and compatibility with CMOS manufacturing process.

Description of Related Art

Recently, semiconductor quantum dots (can be abbreviated as QDs) qubits have emerged as the subject of intensive research. The excellent properties of quantum dots have caused researchers and companies to consider using them in several fields for future development.

Quantum dots are a few nanometers in size and their sizes are very critical for their electrical and optical properties. Quantum dots have electronic properties that differ from high dimensional materials due to quantum confinement. The prior quantum dot manufacturing processes can be based on chemical synthesis, wherein the quantum dots have good size tunability, but the placement precision of quantum dots (especially the inter-dot spacing between quantum dots for quantum entanglement in quantum computing) is difficult, presenting a major challenge in making electrical contacts to specific QDs. Or, the quantum dots can be formed by epitaxial growth, wherein the placement precision of quantum dots is still difficult to achieve. Or else, lithography is another option for forming the quantum dots, but producing lithographically-patterned quantum dots with sufficiently small sizes and inter-dot spacings are difficult in terms of uniformity and reproducibility due to the resolution of lithography techniques (the current size resolution is about 10 nanometers by EUV). In short, the prior quantum dot manufacturing methods are difficult for obtaining sufficiently small, closely-coupled quantum dots with placement precision, to let alone how to tune the size of (and spacing between) quantum dots in the manufacturing process.

Further, under the quantum dot nanometer size and placement requirement, after forming and placing the quantum dots, making electrical contacts to the quantum dots is also a challenge in such a high placement precision requirement. Further, when nanoscale, closely-coupled quantum dots are formed laterally and vertically, making electrodes to specific quantum dots not only one-dimensional, but multiple-dimensional, which greatly increase the difficulty.

Besides the aforementioned problems of the prior quantum dot technology, the operation temperature of quantum dot devices, in particular for quantum computing devices, is another challenge. To date, the operation of quantum-dot qubits can be validated at a very low temperature (for example, lower than 2 K). This operation temperature requirement is strongly related to the sizes of and spacing between the quantum dots.

SUMMARY OF THE INVENTION

To the technical problems above-mentioned, the objects of the present invention are to provide a quantum dot manufacturing method and related quantum dot configuration. The quantum dots produced by this method can be tuned in terms of size and inter-dot spacing using existing CMOS manufacturing processes. Due to this high controllability and reproducibility, these quantum dots are suitable for large-scale quantum computing device fabrication. The semiconductor structure of the present invention in principle can perform quantum transport at relatively high temperatures (>100 K or even room temperature). Further, the sizes of the quantum dots can be downsized to 5 nanometers or less. Importantly, the quantum dot manufacturing method of the present invention is compatible with the existing CMOS manufacturing process, without need for other special devices and processes for making the quantum dots.

In one perspective, the present invention provides a quantum dot manufacturing method, which includes: forming a conductive ridge on a substrate; forming an insulative layer covering the substrate and the conductive ridge, wherein the insulative layer is coated on the conductive ridge to conformally encapsulate the conductive ridge; forming a semiconductor-alloyed layer over the insulative layer, and etching back the semiconductor-alloyed layer to form symmetrical, paired semiconductor-alloyed spacer islands separately at the sidewall edges of the insulative layer; and forming symmetrical quantum dots and their cladding-layers of silicon dioxide through thermal oxidation of the semiconductor-alloyed (such as SiGe-alloyed) spacer islands, wherein the Si content is preferentially oxidized forming cladding silicon dioxide and the Ge content is segregated and then ripened for forming Ge quantum dots.

In another perspective, the present invention provides a paired, quantum dot configuration, which includes: a conductive ridge on a substrate; an insulative layer covering the substrate and the conductive ridge, wherein the insulative layer includes a top portion and two sidewalls over the conductive ridge; a semiconductor mechanism of etching back and thermal oxidation, implemented on a semiconductor-alloyed layer set on the insulative layer; a pair of quantum dots respectively self-organizedly capped by silicon dioxide spacer islands based on the semiconductor mechanism, and the quantum dots adhered to the sidewall edges of the insulative layer; and a pair of conductive ledges adhered to the silicon dioxide spacer islands, wherein each of the conductive ledges is a portion of an electrode self-aligned to the corresponding quantum dot via the silicon dioxide spacer islands.

In order to better understand the above and other aspects of the present invention, the detailed description of the embodiments and the accompanying drawings are provided as follows.

DESCRIPTION OF THE PREFERRED EMBODIMENTS

Figure 1A:
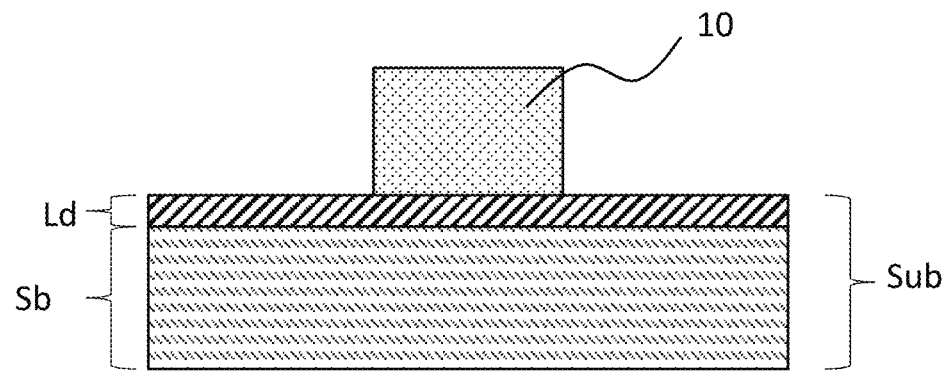
FIGS. 1A-1E show a quantum dot manufacturing method according to one embodiment of the present invention.
Figure 1B:
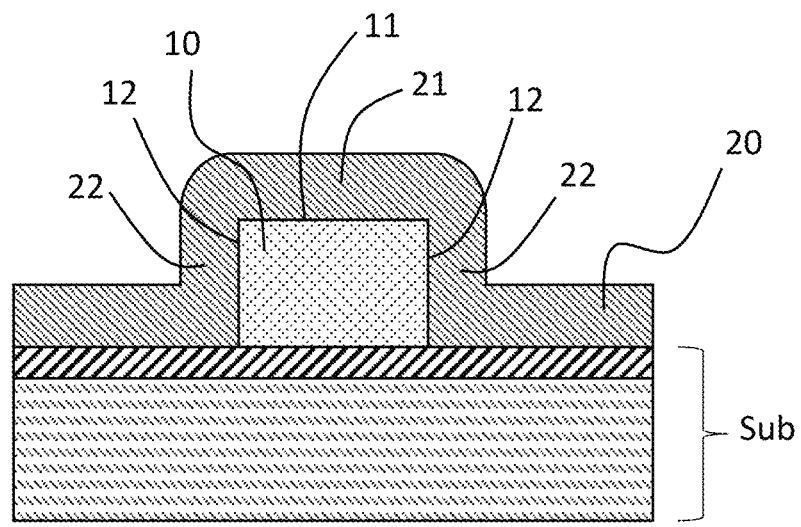
Figure 1C:
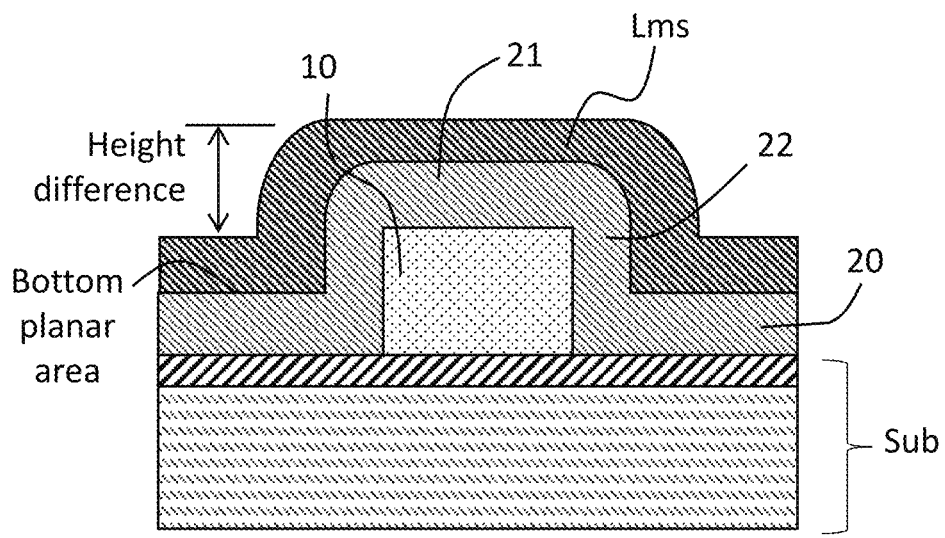
Figure 1D:
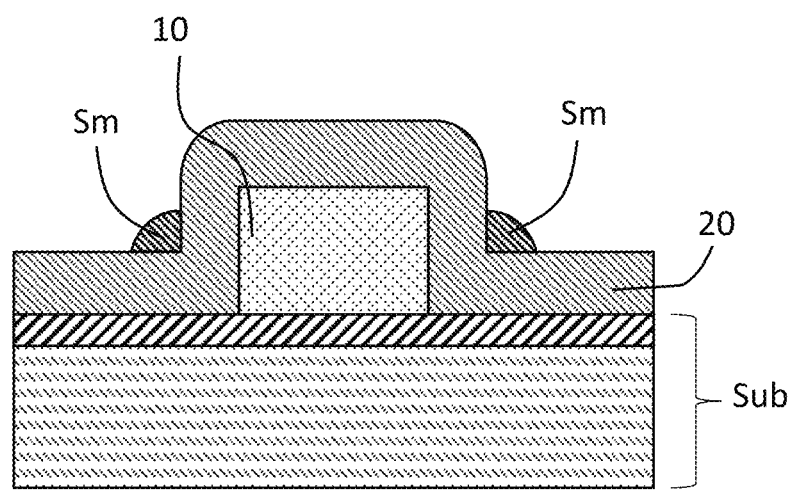
Figure 1E:
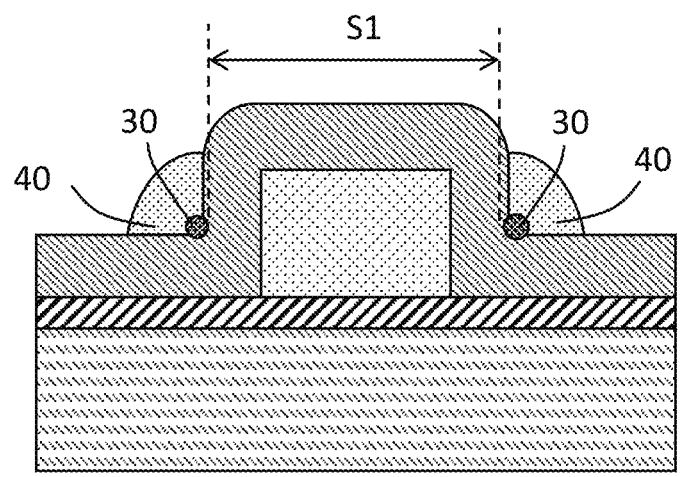

The objectives, technical details, features, and effects of the present invention will be better understood with regard to the detailed description of the embodiments below, with reference to the drawings.

In one perspective, please refer to FIGS. 1A-1E, the present invention provides a quantum dot manufacturing method, which includes: forming a conductive ridge 10 (including a conductive material therein) on a substrate Sub (FIG. 1A); forming an insulative layer 20 to cover the substrate Sub and the conductive ridge 10 (FIG. 1B), wherein the insulative layer 20 is coated on the conductive ridge 10 to conformally form a top portion 21 on a top 11 of the conductive ridge 10 and two sidewalls 22 adhered to two sidewalls 12 of the conductive ridge 10; conformally forming a semiconductor-alloyed layer Lms over the insulative layer 20 (FIG. 1C), and etching back the semiconductor-alloyed layer Lms to form a plurality of semiconductor-alloyed spacer islands Sm separately adhered to the sidewalls 21 of the insulative layer 20 (FIG. 1D), wherein because of a height difference between the semiconductor-alloyed layer Lms on the top portion 21 and the semiconductor-alloyed layer Lms on a bottom planar area, the semiconductor-alloyed layer Lms adhered to the sidewalls 22 of the insulative layer 20 are etched into the semiconductor-alloyed spacer islands Sm after etching; and through thermal oxidation in the semiconductor-alloyed spacer islands Sm, forming a plurality of quantum dots 30 and a plurality of silicon dioxide spacer islands 40 (FIG. 1E), wherein the quantum dots 30 are gradually pushed inward (spacing S1 is getting shorter) during forming the silicon dioxide spacer islands 40.

In one embodiment, the quantum dot manufacturing method further includes: forming a conductive layer Lc over the silicon oxidation spacer islands 40 and the insulative layer 20 (FIG. 1F), and etching back the conductive layer Lc to form a plurality of conductive ledges 50 adhered to the silicon dioxide spacer islands 40 (FIG. 1G), wherein each of the conductive ledges 50 can be used a portion of an electrode with self-alignment to the corresponding neighborhood quantum dot 30. With these silicon dioxide spacer islands 40, the electrodes can have very good alignments to the quantum dots, which solved the prior problem of poor alignment between the electrodes and the quantum dots. Regarding the forming of the conductive ledges 50, please refer to the aforementioned explanation of forming the semiconductor-alloyed spacer islands Sm, for the detail of forming the conductive ledges 50.

In one embodiment, when the semiconductor-alloyed layer Lms includes a silicon-germanium alloy ($Si_{1-x}Ge_x$), wherein a molecular ratio (X) means a proportion of germanium in the silicon-germanium alloy. The molecular ratio of germanium is a proportion of germanium in the silicon-germanium alloy, based on Ge segregation and condensation from the silicon-germanium alloy. The molecular ratio of germanium exists in the silicon-germanium alloy is preferred in the range about 0 to 0.7. In the thermal oxidation, germanium is segregated in the silicon-germanium alloy to form germanium quantum dots by condensation; and silicon therein is simultaneously oxidized, to form silicon dioxide spacer islands 40 respectively adhered to the two sidewalls 22. During the thermal oxidation, volumes of silicon dioxide spacer islands 40 grow such that the quantum dots 30 are gradually pushed inward due to gradually larger volumes of the silicon dioxide spacer islands 40. Besides, when a molecular ratio (X) of germanium exists in the silicon-germanium alloy is higher (lower), and/or the semiconductor alloyed spacer islands have higher (less) Ge contents, the sizes of the formed germanium quantum dots 30 can be bigger (smaller). Therefore, according to this principle, the sizes of germanium quantum dots 30 can be controlled and tunable.

In the aforementioned embodiment, the germanium quantum dots are used to illustrate the feature of the present invention. However, the metal can be not limited to germanium, such as, GeSn, SiC, GaAs, and so on.

Figure 1F:
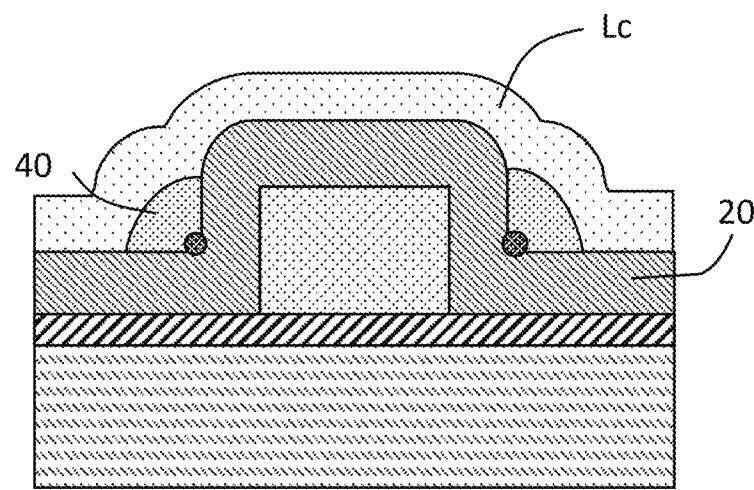
FIGS. 1F and 1G show a conductive ledge manufacturing process according to one embodiment of the present invention.
Figure 1G:
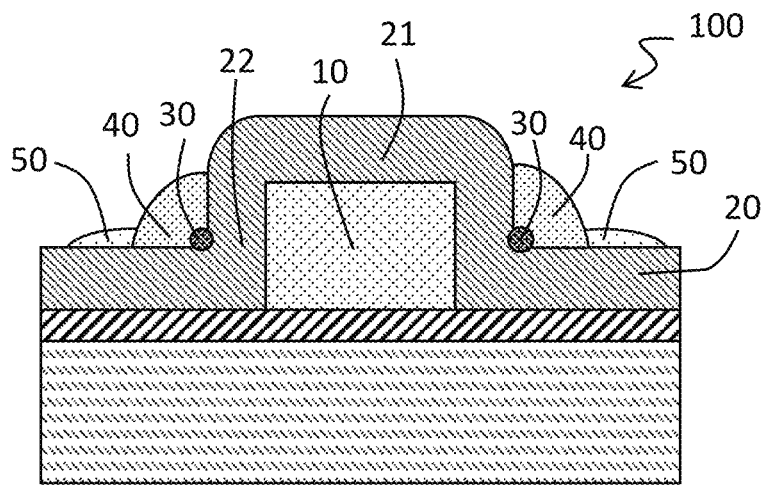

Please refer to FIG. 1G, in one embodiment, with reference to the conductive ridge 10, wherein the quantum dots 30 on two sides of the conductive ridge are symmetric. This "symmetric" is a very important feature for quantum computing, because it can provide high and controllable quantum entanglement performance. Further, the "symmetric" in the present invention includes not only "mirror symmetric", but other symmetric possibilities; for example, rotational symmetry, etc.

In one embodiment, a material of the insulative layer can include: silicon nitride, titanium nitride, or other Si-based insulative materials.

Please refer to FIG. 1A, in the present invention, the substrate Sub can be a base structure for forming various semiconductor structure thereon. The substrate can include a silicon base Sb and a dielectric layer Ld thereon, wherein a material of the dielectric layer Ld can include a high-temperature dielectric material or high-k dielectric material, such as silicon dioxide or silicon nitride, respectively, which can perform quantum transport of the present invention at relatively high temperatures (>100 K or even room temperature). The quantum dot semiconductor structure of the present invention can be formed on the dielectric layer Ld, the silicon base Sb, or the silicon base Sb with another insulation means in between the quantum dot semiconductor structure and the silicon base Sb.

In one embodiment, a material of the conductive ridge includes poly-silicon.

Figure 1H:
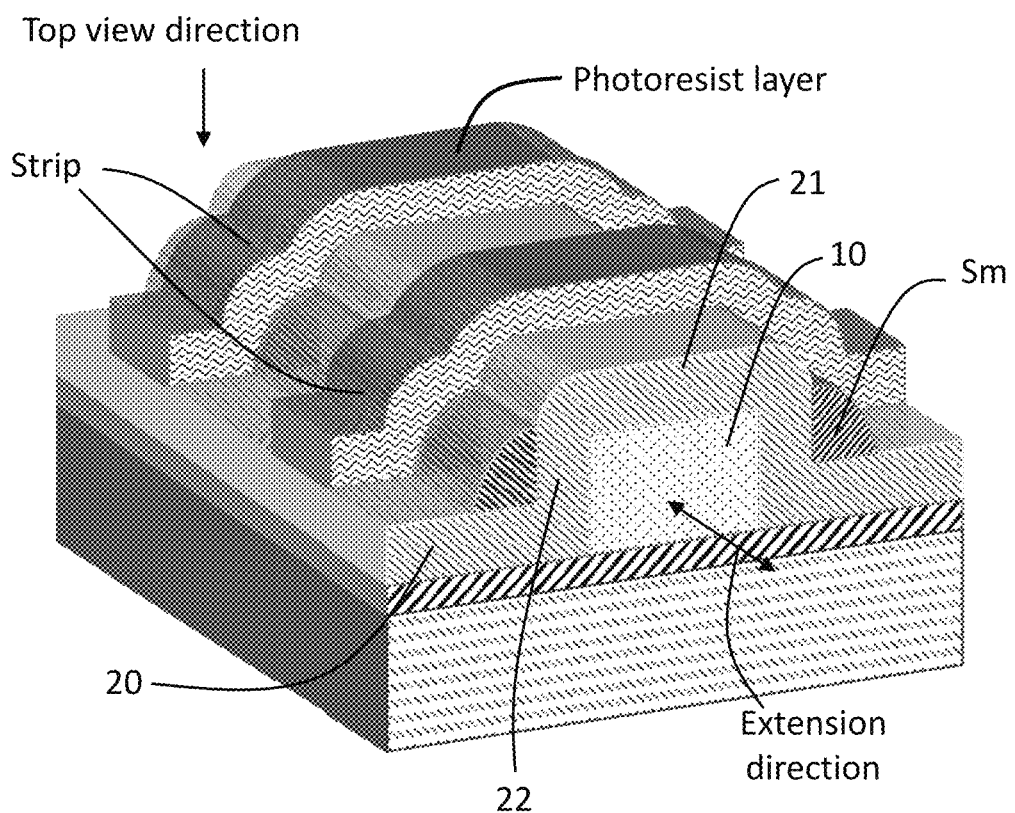
FIGS. 1H and 1I show a perspective view of a separated quantum dot semiconductor structure manufacturing process according to one embodiment of the present invention.
Figure 1I:
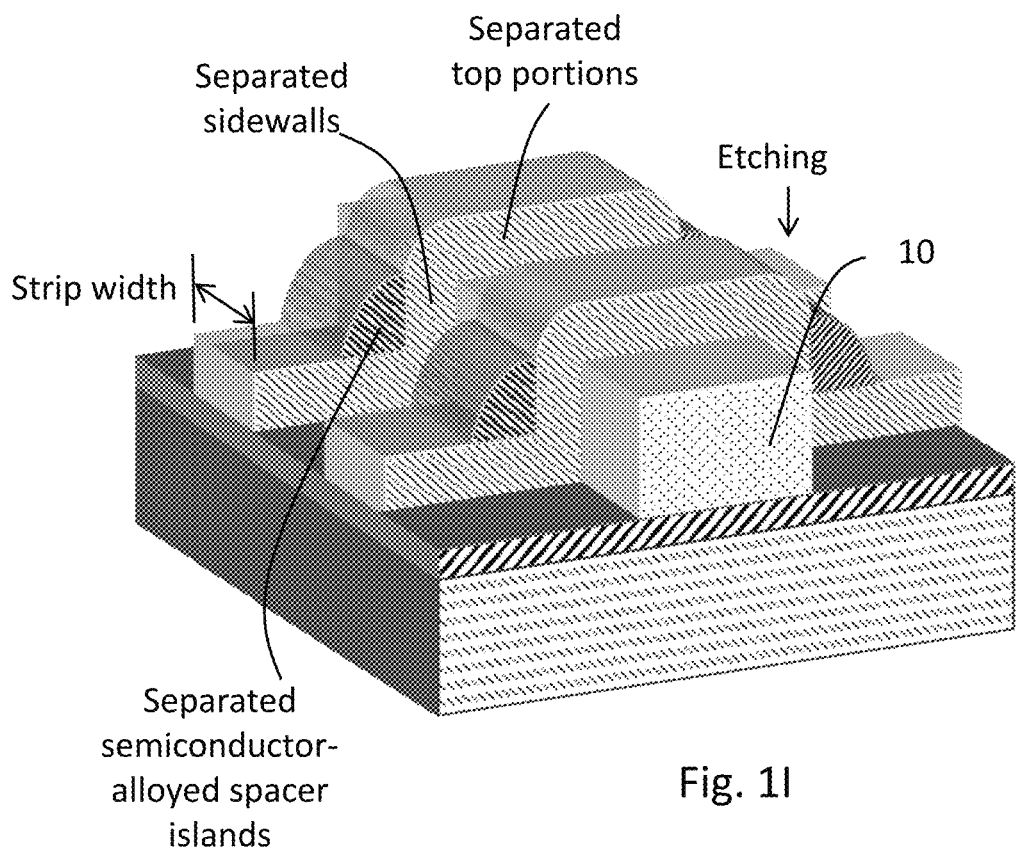

In one embodiment, as shown in FIG. 1H-1I, the step of forming semiconductor-alloyed spacer islands Sm adhered to the sidewalls 22 of the insulative layer 20, further includes: forming a photoresist layer in a mask pattern of a plurality of strips over the top portion 21, the sidewalls 22 and the semiconductor-alloyed spacer islands Sm (FIG. 1H); and photo etching the top portion 21, the sidewalls 22 and the semiconductor-alloyed spacer islands Sm according to the mask pattern, to form a plurality of strip groups with separated top portions, separated sidewalls, and separated semiconductor-alloyed spacer islands (FIG. 1I). In a top view direction (FIG. 1H), the aforementioned strip groups are substantially perpendicular to the extension direction of the conductive ridge 10. After the etching, the volumes of the separated semiconductor-alloyed spacer islands are respectively related to the sizes of germanium quantum dots in each group; that is, the strip widths of the separated semiconductor-alloyed spacer islands are related to the sizes of germanium quantum dots. In addition, in a top view direction (FIG. 1I), the plurality of strip groups with separated top portions, separated sidewalls, and separated semiconductor-alloyed spacer islands are parallel allocated over the conductive ridge 10, to perform excellent quantum computing function.

Figure 2:
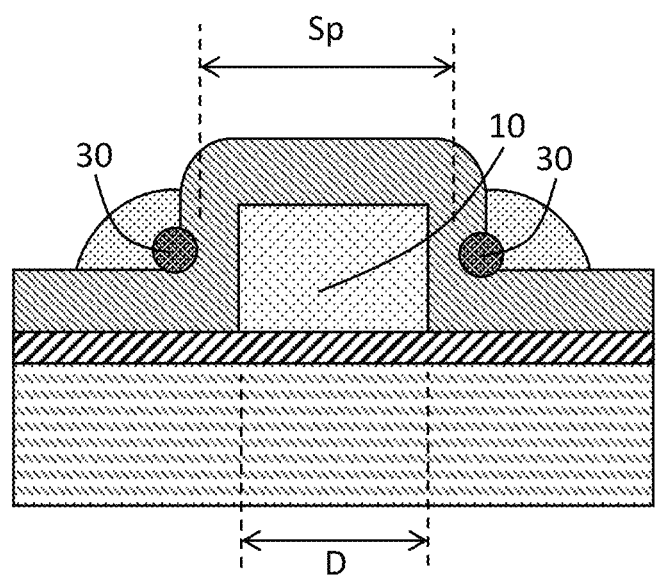
FIG. 2 shows a quantum dot semiconductor structure according to one embodiment of the present invention.

Please refer to FIG. 2, in quantum computing, an inter-dot spacing Sp between the quantum dots 30 is important for quantum entanglement and superposition behavior. In one embodiment, the width of the conductive ridge D can be used to control the inter-dot spacing Sp. Furthermore, a time period through the thermal oxidation process can be also used to control the inter-dot spacing Sp. For example, when the time period is longer, the volumes of silicon dioxide spacer islands grow further such that the quantum dots 20 are gradually pushed inward (shorter Sp), and the time period can be used to control the inter-dot spacing Sp.

In the present invention, the quantum dots 30 are formed by gradually reducing the germanium in the semiconductor (SiGe) alloy in the thermal oxidation, and pushed inward by the growth of the silicon dioxide spacer islands 40. In this process, the formed quantum dots 30 completely coalesced and each of the quantum dots has a single crystal structure, such that the quantum dots formed by the present invention have good quantum performance.

Please refer to FIG. 1G, in another perspective, the present invention provides a quantum dot semiconductor structure 100, which includes: a conductive ridge 10 on a substrate Sub; an insulative layer 20 covering the substrate and the conductive ridge, wherein the insulative layer 20 includes a top portion 21 and two sidewalls 22 over the conductive ridge 10; a plurality of quantum dots 30 respectively disposed within a plurality of silicon dioxide spacer islands 40, and the silicon dioxide spacer islands 40 adhered to the sidewalls 21 of the insulative layer 20; and a plurality of conductive ledges 50 adhered to the silicon dioxide spacer islands 40, wherein each of the conductive ledges 50 is a portion of an electrode with alignment to the corresponding quantum dot 30.

Figure 3A:
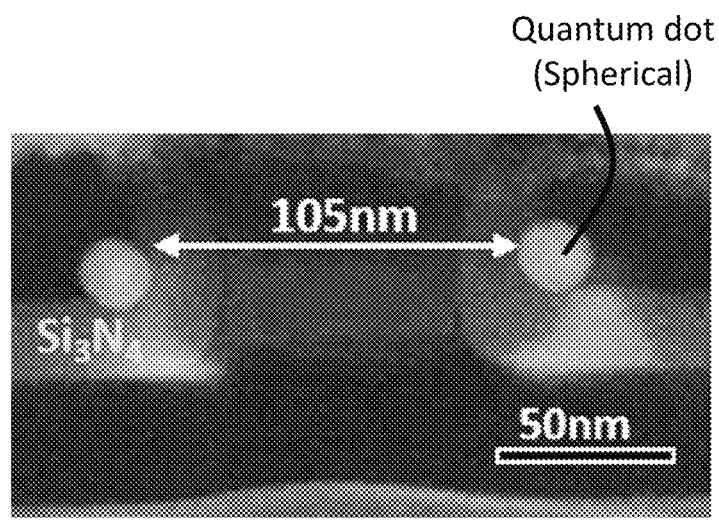
FIGS. 3A and 3B show various inter-dot spacing tuning statuses according to the present invention.
Figure 3B:
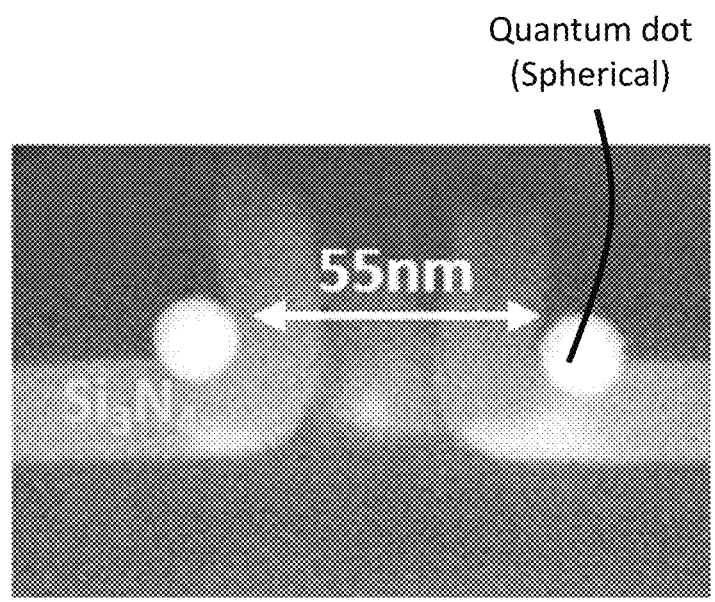

Regarding the inter-dot spacing tuning, please refer to FIGS. 3A and 3B, wherein the inter-dot spacings are various between two sections of real quantum dot semiconductor structures with different widths of the conductive ridges. It is shown that the inter-dot spacing in the present invention can be controlled. Besides the ridge widths, the inter-dot spacing can be also controlled by the time period of the thermal oxidation process.

Figure 4A:
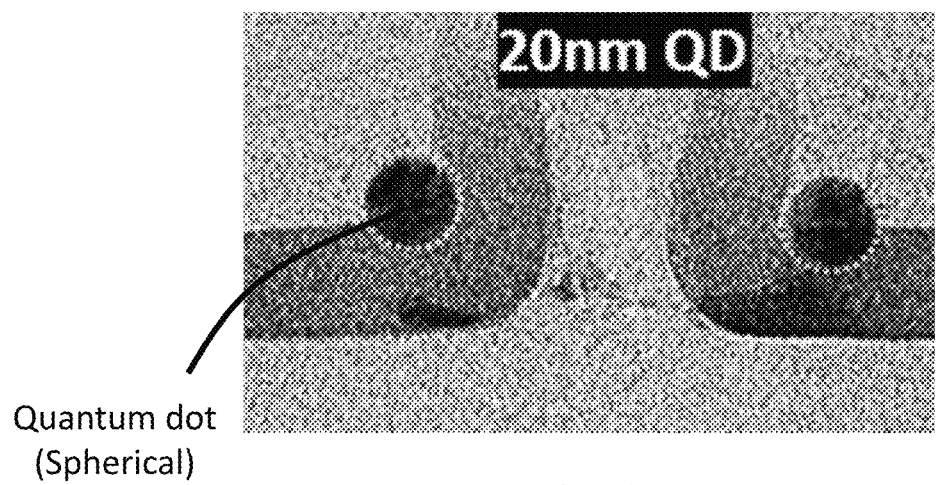
FIGS. 4A-4C show various quantum dot tuning statuses according to the present invention.
Figure 4B:
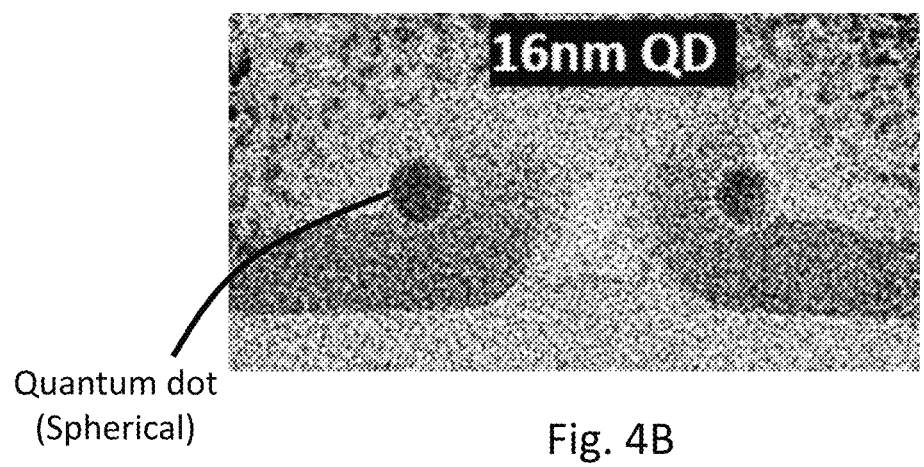
Figure 4C:
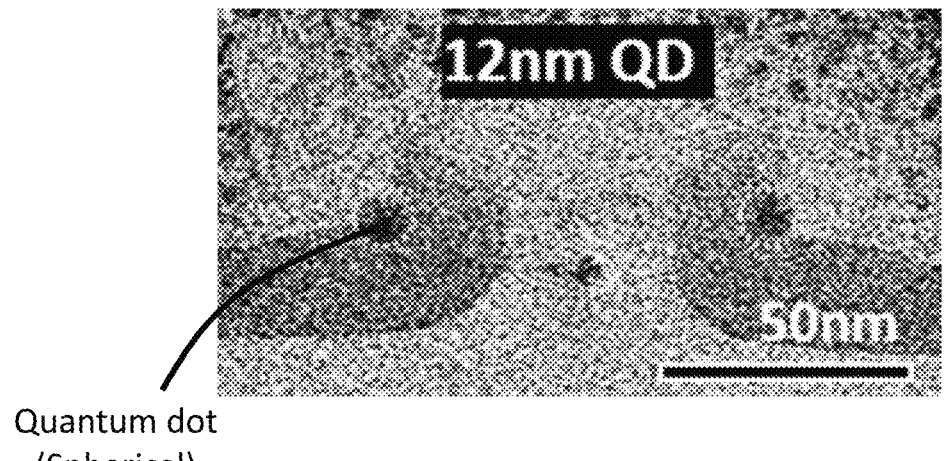

Regarding the quantum dot size tuning, please refer to FIGS. 4A, 4B, and 4C, wherein the quantum dot sizes are different among sections of several quantum dot semiconductor structures. It shows that the quantum dot sizes by the present invention can be various. According to the present invention, the control of quantum dot sizes can be done according to the time period of the thermal oxidation process, the volumes of the semiconductor-alloyed spacer islands, and/or the molecular ratio of germanium exists in the silicon-germanium alloy.

As shown in FIGS. 3A, 3B, 4A, 4B and 4C, the shapes of the manufactured quantum dots are spherical, and these shapes have the benefit of low surface energy. In comparison with the pyramid shape according to the prior epitaxial growth, the spherical shapes of the quantum dots provided by the present invention have a higher quantum property stability. Also, the electrostatic potential of a spherical quantum dot is radially symmetric, giving rise to the atom-like orbitals. The symmetry of this three-dimensional steep potential of a tiny quantum dot leads to a complete filling of orbitals of 1s, 2s, 2p, 3s, and 3p for 2, 10, 18 electrons in sequence with very large addition energies, which is a powerful knob for controlling electron number when a quantum-dot device operating in the few-electron regime.

Figure 5A:
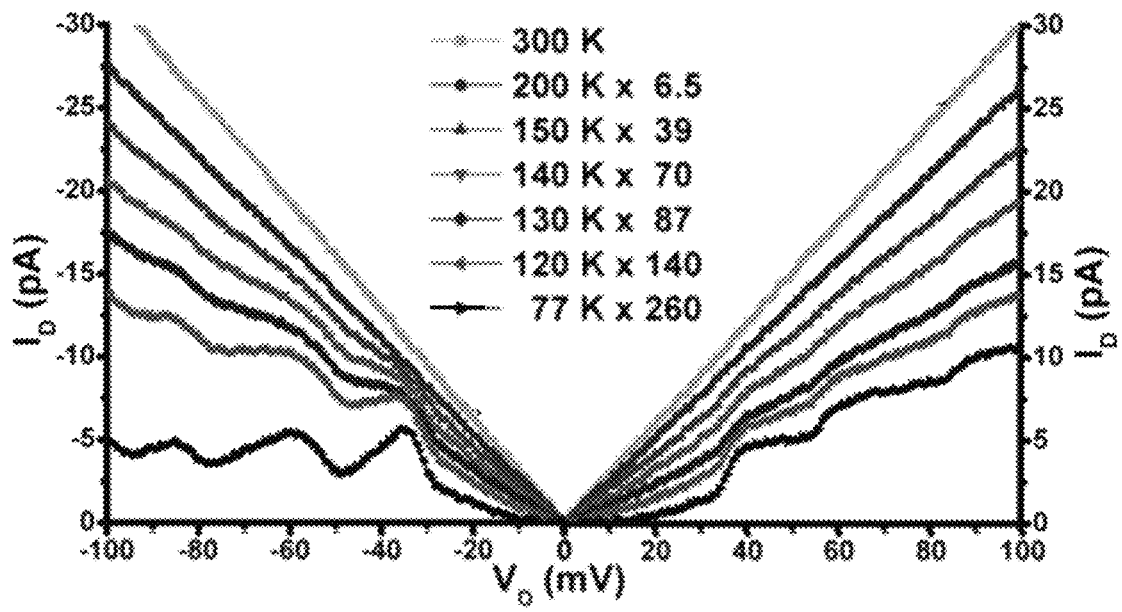
FIGS. 5A and 5B show ID-VD and GD-VD characteristics of the quantum dot semiconductor structure of the present invention at temperature 77K-300K.
Figure 5B:
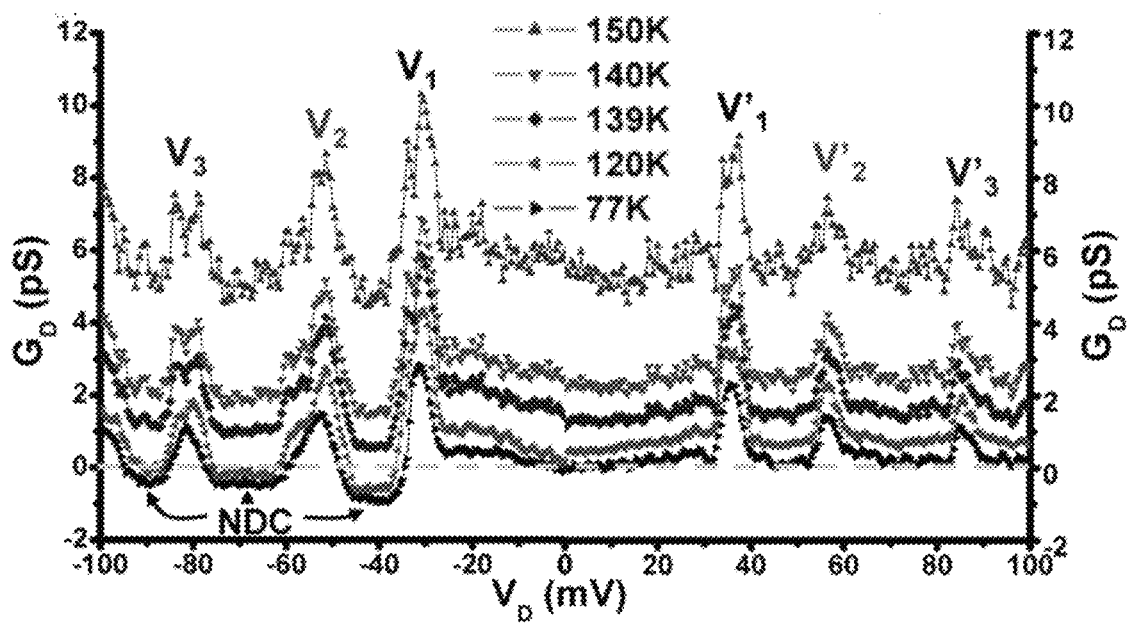

FIGS. 5A and 5B show $I_D$-$V_D$ and $G_D$-$V_D$ characteristics of the quantum dot semiconductor structure of the present invention at temperature 77K-300K using nano-probing techniques. $I_D$ is represented as a drain current, $V_D$ is represented as a drain voltage, and $G_D$ is represented as a differential conductance, $G_D$=$dI_D/dV_D$. The nonlinear drain current characteristics as a function of drain voltage were measured in the few-hole regime when both gate and source electrodes are grounded (FIG. 5A), and extracted $G_D$ characteristics are plotted in FIG. 5B.

In one embodiment, the quantum dot semiconductor structure of the present invention can be applied to a variety of electronic devices, especially to the electronic devices with light, thin, and small size. For example, the quantum dot semiconductor structure of the present invention can be applied to quantum computing devices, quantum processing units (QPU), quantum chip, QBoard, quantum computing platform, cellular phones, tablet computers, portable electronic devices, wearable electronic devices, etc.

The present invention has been described in considerable detail with reference to certain preferred embodiments thereof. It should be understood that the description is for illustrative purpose, not for limiting the scope of the present invention. Those skilled in this art can readily conceive variations, combinations and modifications within the spirit of the present invention.

What is claimed is:

1. A self-organized quantum dot semiconductor structure, comprising:
   a conductive ridge on a substrate;
   an insulative layer covering the substrate and the conductive ridge, wherein the insulative layer includes a top portion and two sidewalls over the conductive ridge;
   a plurality of quantum dots respectively embedded within a plurality of silicon dioxide spacer islands, the quantum dots and the silicon dioxide spacer islands adhered to the sidewalls of the insulative layer, wherein the plurality of quantum dots are formed by a semiconductor process of etching and thermal oxidation of a semiconductor alloyed layer; and
   a plurality of conductive ledges adhered to the silicon dioxide spacer islands, wherein each of the conductive ledges is a portion of an electrode self-alignment to the corresponding neighborhood quantum dot.

2. The self-organized quantum dot semiconductor structure of claim 1, wherein the semiconductor-alloyed layer includes a silicon-germanium (Ge), Gen, SiC, or GaAs.

3. The self-organized quantum dot semiconductor structure of claim 1, wherein the semiconductor-alloyed layer includes a silicon-germanium alloy, wherein a molecular ratio of germanium is a proportion of germanium in the silicon-germanium alloy.

4. The self-organized quantum dot semiconductor structure of claim 3, wherein during the semiconductor process, the germanium is segregated and condensated in the silicon-germanium alloy to form germanium quantum dots; and silicon therein is simultaneously oxidized to form silicon dioxide spacer islands respectively adhered to the sidewalls of the insulative layer.

5. The self-organized quantum dot semiconductor structure of claim 4, wherein the germanium quantum dots are formed by Ge segregation and condensation from the silicon-germanium alloy when the molecular ratio (in the range about 0 to 0.7) of germanium exists in the silicon-germanium alloy is high, and/or the semiconductor alloyed spacer islands have high Ge contents, the sizes of the quantum dots are big; when the molecular ratio (in the range about 0 to 0.7) of germanium exists in the silicon-germanium alloy is low, and/or the semiconductor alloyed spacer islands have less Ge contents, the sizes of the quantum dots are small.

6. The self-organized quantum dot semiconductor structure of claim 5, wherein the sizes of the quantum dots are controlled and tunable by the molecular ratio of germanium.

7. The self-organized quantum dot semiconductor structure of claim 1, wherein the quantum dots adhered to the sidewalls of the insulative layer are mirror and rotational symmetric with reference to the conductive ridge.

8. The self-organized quantum dot semiconductor structure of claim 1, wherein the insulative layer includes: silicon nitride, or Si-based insulative materials.

9. The self-organized quantum dot semiconductor structure of claim 1, wherein the substrate includes a silicon base and a dielectric layer thereon, wherein a material of the dielectric layer includes silicon dioxide.

10. The self-organized quantum dot semiconductor structure of claim 1, wherein the conductive ridge includes poly-silicon.

11. The self-organized quantum dot semiconductor structure of claim 1, further comprising a plurality of strip groups with separated top portions, separated sidewalls, and separated semiconductor-alloyed spacer islands, which are substantially perpendicular to an extension direction of the conductive ridge.

12. The self-organized quantum dot semiconductor structure of claim 1, wherein the quantum dots are completely coalesced and have a single crystal structure.

13. The self-organized quantum dot semiconductor structure of claim 1, wherein an inter-dot spacing between the quantum dots corresponds to a width of the conductive ridge, and/or a time period of the semiconductor mechanism.

14. The self-organized quantum dot semiconductor structure of claim 1, wherein the quantum dots and the silicon dioxide spacer islands are formed simultaneously.

15. The self-organized quantum dot semiconductor structure of claim 1, wherein the plurality of quantum dots and the plurality of conductive ledges perform quantum transport at temperatures higher than 100K or at room temperature.

16. A self-organized quantum dot semiconductor structure applied to a quantum computing device, comprising:
    a conductive ridge on a substrate;
    an insulative layer covering the substrate and the conductive ridge, wherein the insulative layer includes a top portion and two sidewalls over the conductive ridge;
    a plurality of quantum dots respectively embedded within a plurality of high-temperature dielectric spacer islands, the quantum dots and the plurality of high-temperature dielectric spacer islands adhered to the sidewalls of the insulative layer, wherein the plurality of quantum dots are formed by a semiconductor process of etching and thermal oxidation of a semiconductor alloyed layer; and
    a plurality of conductive ledges adhered to the silicon dioxide spacer islands, wherein each of the conductive ledges is a portion of an electrode self-alignment to the corresponding neighborhood quantum dot.

17. The self-organized quantum dot semiconductor structure of claim 16, wherein the high-temperature dielectric spacer islands include silicon dioxide spacer islands.

* * * * *